(12) United States Patent
Pachamuthu et al.

(10) Patent No.: US 11,450,575 B2
(45) Date of Patent: Sep. 20, 2022

(54) SYSTEM AND METHOD FOR DIE CRACK DETECTION IN A CMOS BONDED ARRAY

(71) Applicant: Western Digital Technologies, Inc., San Jose, CA (US)

(72) Inventors: Jayavel Pachamuthu, San Jose, CA (US); Kirubakaran Periyannan, Santa Clara, CA (US); Daniel Linnen, Naperville, IL (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/181,648

(22) Filed: Feb. 22, 2021

(65) Prior Publication Data

US 2022/0108926 A1    Apr. 7, 2022

Related U.S. Application Data

(60) Provisional application No. 63/087,611, filed on Oct. 5, 2020.

(51) Int. Cl.
*H01L 21/66* (2006.01)
*G01R 31/312* (2006.01)

(52) U.S. Cl.
CPC ............ *H01L 22/12* (2013.01); *G01R 31/312* (2013.01); *H01L 22/14* (2013.01); *H01L 22/34* (2013.01)

(58) Field of Classification Search
CPC ......... H01L 22/12; H01L 22/14; H01L 22/34; G01R 31/312
See application file for complete search history.

(56) References Cited

U.S. PATENT DOCUMENTS

| | | | |
|---|---|---|---|
| 9,431,338 B2 | 8/2016 | Priel et al. | |
| 2005/0023656 A1* | 2/2005 | Leedy | H01L 27/115 438/106 |
| 2017/0125360 A1* | 5/2017 | Lee | H01L 23/5283 |
| 2018/0047644 A1* | 2/2018 | Davis | H01L 22/14 |
| 2019/0033365 A1* | 1/2019 | Sanchez | H01L 23/585 |

* cited by examiner

*Primary Examiner* — Jermele M Hollington
*Assistant Examiner* — Suresh K Rajaputra
(74) *Attorney, Agent, or Firm* — Crowell & Moring LLP

(57) ABSTRACT

A system and method for die crack detection in a CMOS bonded array includes a capacitor that is formed in an edge seal, where one of the capacitor plates is in the edge seal portion of a first wafer, and the other capacitor plate is in the edge seal portion of a second wafer. A crack in the die can be detected by applying an alternating current waveform to a testing contact on the integrated circuit and monitoring for a shift in the alternating current waveform, as a crack would cause modulation in the capacitance.

20 Claims, 7 Drawing Sheets

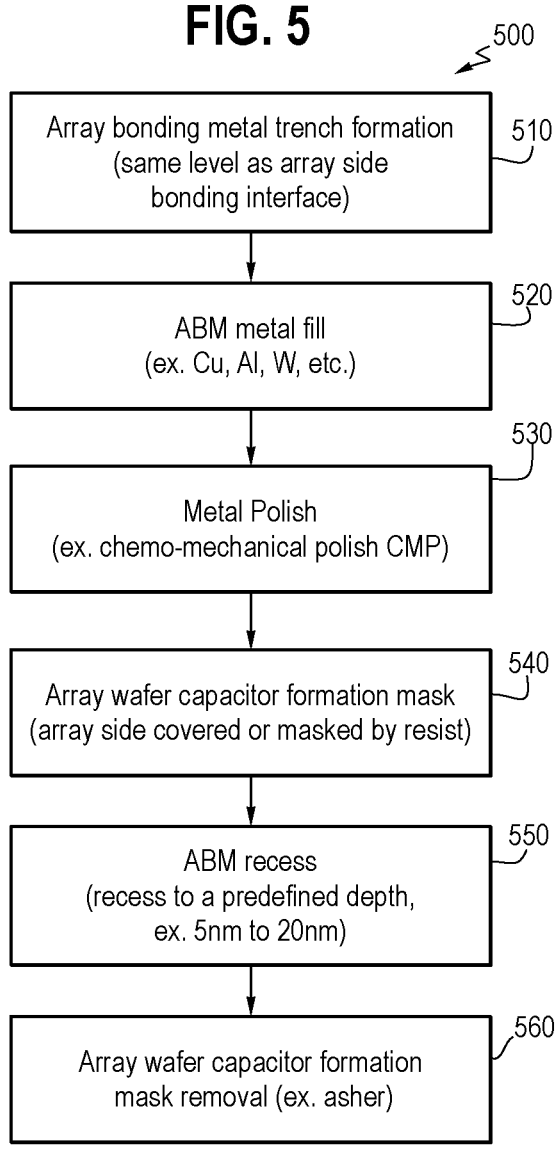
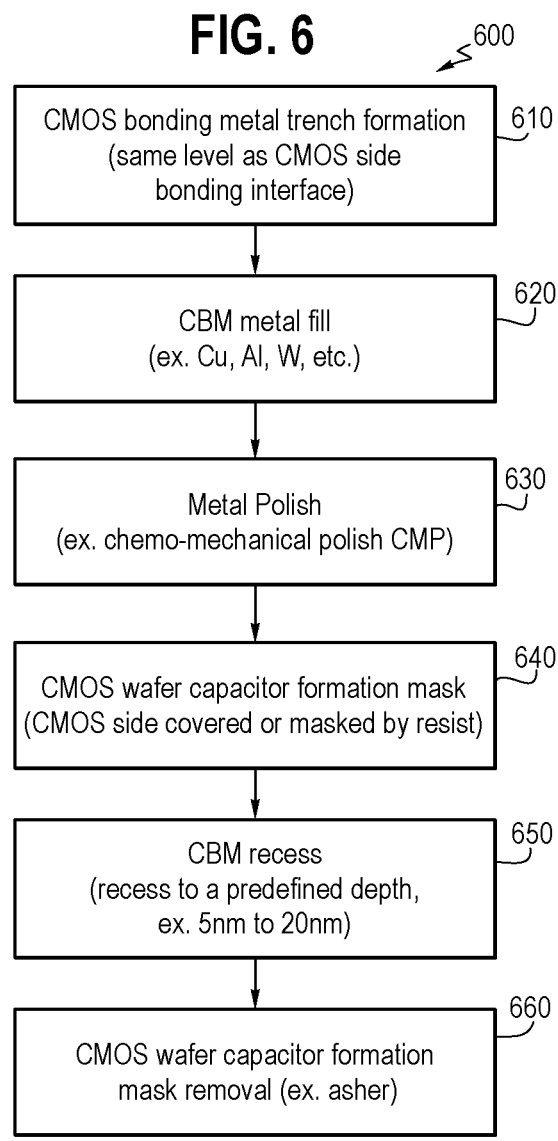

SYSTEM AND METHOD FOR DIE CRACK DETECTION IN A CMOS BONDED ARRAY

CROSS-REFERENCE TO RELATED APPLICATION

This application claims the benefit of U.S. provisional patent application No. 63/087,611, filed Oct. 5, 2020, which is hereby incorporated by reference.

BACKGROUND

In order to increase circuit density without increasing package size, a die may be directly attached or bonded to another die, connecting the integrated circuits of the respective dies. For efficient assembly, two wafers, each having many dies, may be bonded and the bonded dies later cut from the bonded wafers using wafer-to-wafer bonding technology. For example, a wafer containing memory or NAND dies may be be bonded to a wafer having controller dies, which may be fabricated from complementary metal-oxide-semiconductor (CMOS) circuits. The resulting structure is referred to as a CMOS bonded array. A crack in the structure (e.g., created by warpage in one or both of the wafers, thermal stress, or dicing complications) can result in a die that is not functional.

BRIEF DESCRIPTION OF THE DRAWINGS

FIG. 5 is a flow chart of a method of an embodiment for fabricating a capacitor plate in an edge seal portion of a first wafer.

FIG. 6 is a flow chart of a method of an embodiment for fabricating a capacitor plate in an edge seal portion of a second wafer.

DETAILED DESCRIPTION

By way of introduction, the following embodiments provide a Design for Test (DFT) structure for detecting a crack in a die/integrated circuit, e.g., due to die/wafer warpage in one or both wafers, thermal stress, or dicing complications in a complementary metal-oxide-semiconductor (CMOS) bonded array (CBA). In one example, the DFT structure is a capacitor that is formed in an edge seal of a die, where one of the capacitor plates is in the edge seal portion of the first wafer, and the other capacitor plate is in the edge seal portion of the second wafer. A crack in the integrated circuit can be detected by applying an alternating current waveform to a testing contact on the integrated circuit and monitoring for a shift in the alternating current waveform, as a crack would cause modulation in the capacitance.

Figure 1:
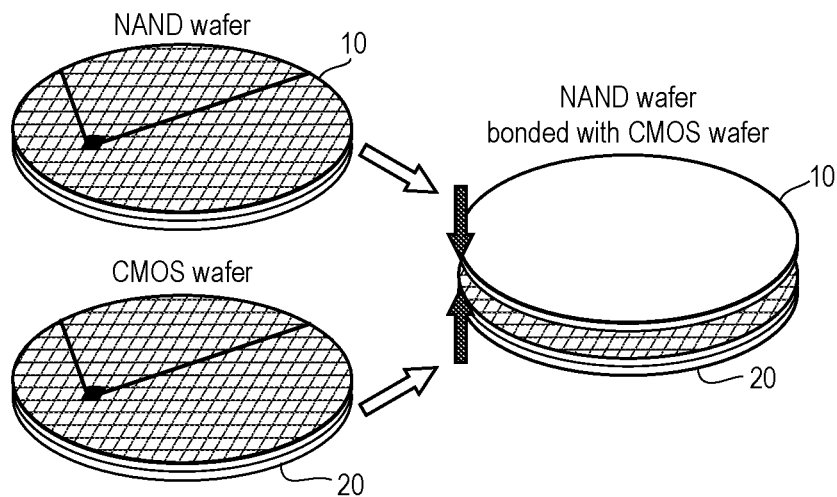
FIG. 1 is a diagram of two bonded wafers of an embodiment.

Turning now to the drawings, FIG. 1 is a diagram of two bonded wafers 10, 20 of an embodiment. The first and second wafers 10, 20 can take any suitable form. For example, in this embodiment, the first wafer 10 comprises a plurality of memory dies, each of the memory dies comprising a memory array (here, a NAND memory array), and the second wafer 20 comprises a plurality of controller dies, each of the controller dies comprising peripheral (control) circuitry for the memory arrays. In one embodiment, the control dies/second wafer comprise complementary metal-oxide-semiconductor (CMOS) circuitry. Such a bonded wafer may find use in three-dimensional Bit Cost Scalable (BiCS) flash memory technology. The peripheral circuitry can contain, for example, transistors, logic signals, and circuitry for controlling and driving memory elements to accomplish functions such as programming and reading. It should be noted that these are merely examples, and other implementations can be used.

The first and second wafers 10, 20 can be fabricated separately and then bonded together by bonding a plurality of contact pads of each of the wafers 10, 20 together. The resulting integrated circuit can yield one memory die or a plurality of memory dies, which can be diced to create individual memory dies. As a wafer can contain one or more than one die, the term "wafer," as used herein, is intended to broadly refer to an individual memory die or to a plurality of memory dies.

Figure 2:
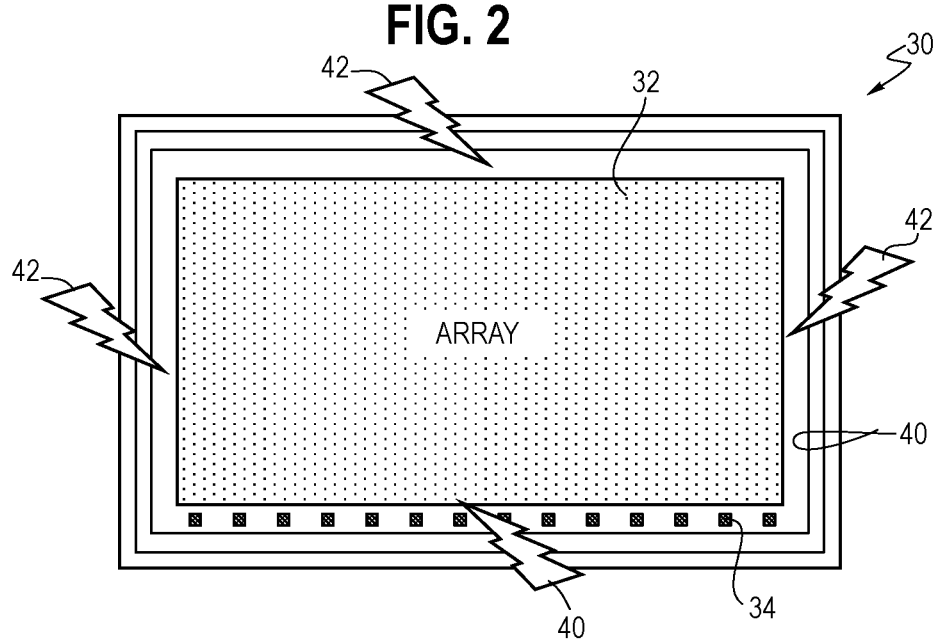
FIG. 2 is a top view of an integrated circuit of an embodiment.

FIG. 2 is a top view of an integrated circuit/die 30 after the first and second wafers 10, 20 have been bonded together, and the integrated circuit 30 has been diced from the bonded wafers. As shown in FIG. 2, a memory array 32 of the first wafer 10 is on the top of the bonded stack. The plurality of contacts 34 of the memory array 32 are shown in FIG. 2, and a corresponding plurality of contacts of the peripheral circuitry and the peripheral circuitry itself are located under the memory array 32 and, therefore, are not shown in FIG. 2. FIG. 2 also shows that the integrated circuit 30 in this example comprises an edge seal, which, in this embodiment, comprises three grounded metal walls or rings 40. While three walls 40 are shown in this example, it should be understood that fewer or more walls can be used. In general, the edge seal is positioned around the perimeter of the die 30 to seal the edge of the die 30 from contaminants (e.g., charged ions, radicals, or moisture) that can be negatively affect yield during fabrication and/or negatively affect performance after fabrication.

Figure 3:
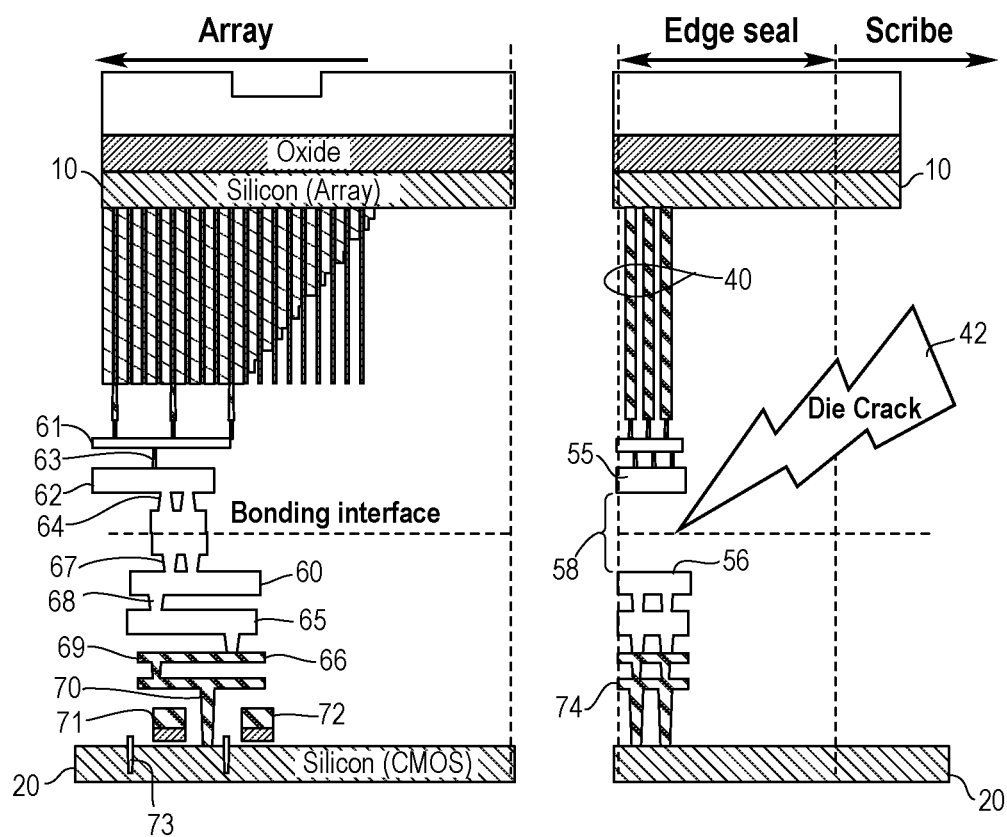
FIG. 3 is a cross-sectional view of an integrated circuit of an embodiment.

FIG. 3 is a cross-sectional view of the integrated circuit 30. As shown in FIG. 3, the first wafer 10 in this embodiment comprises an oxide layer, a silicon (array) layer, and the plurality of contacts 34, and the second wafer 20 comprises a silicon (CMOS) layer. The two wafers 10, 20 comprise structures that are bonded together at the bonding interfaces. The structures on the first wafer 10 comprise a plurality of metal wires 61, 62 and connecting metal-filled vertical interconnect access structures (vias) 63, 64. The structures on the second wafer 20 comprise a plurality of metal wires 60, 65, 66, connecting vias 67, 68, 69, a CMOS transistor 71, 72, a CMOS source/drain contact 70 to the CMOS transistor 71, 72, and shallow trench isolation 73.

FIG. 3 also shows the edge seal located at the edge of the die. To the right of the edge seal is the scribe line, where the die would be diced from the bonded wafers 10, 20. FIG. 3 shows that the three walls 40 noted above are in the portion of the edge seal that is located in the first wafer 10. As also shown in FIG. 3, there is a gap 58 between the metal structures 55, 56, 74 in the portions of the edge seal that are located in the first and second wafers 10, 20.

As illustrated by lightening bolts 42 in FIGS. 2 and 3, a crack in the edge seal can occur (e.g., at any location, not necessarily the shown locations of the bolts 42). A crack can be caused, for example, by warpage in one or both of the wafers 10, 20, thermal stress, dicing complications, or die handling complications. When a die crack 42 occurs, there can be a discontinuity in the bonding interface. Unfortunately, it can be difficult or impossible to detect this problem, and a serious yield issue can occur during packaging and cross-temperature tests. For example, many devices with this mode of fracture can pass a full functional test without any sign of an internal problem (e.g., an electrical open-short test may not detect a die crack).

Figure 4:
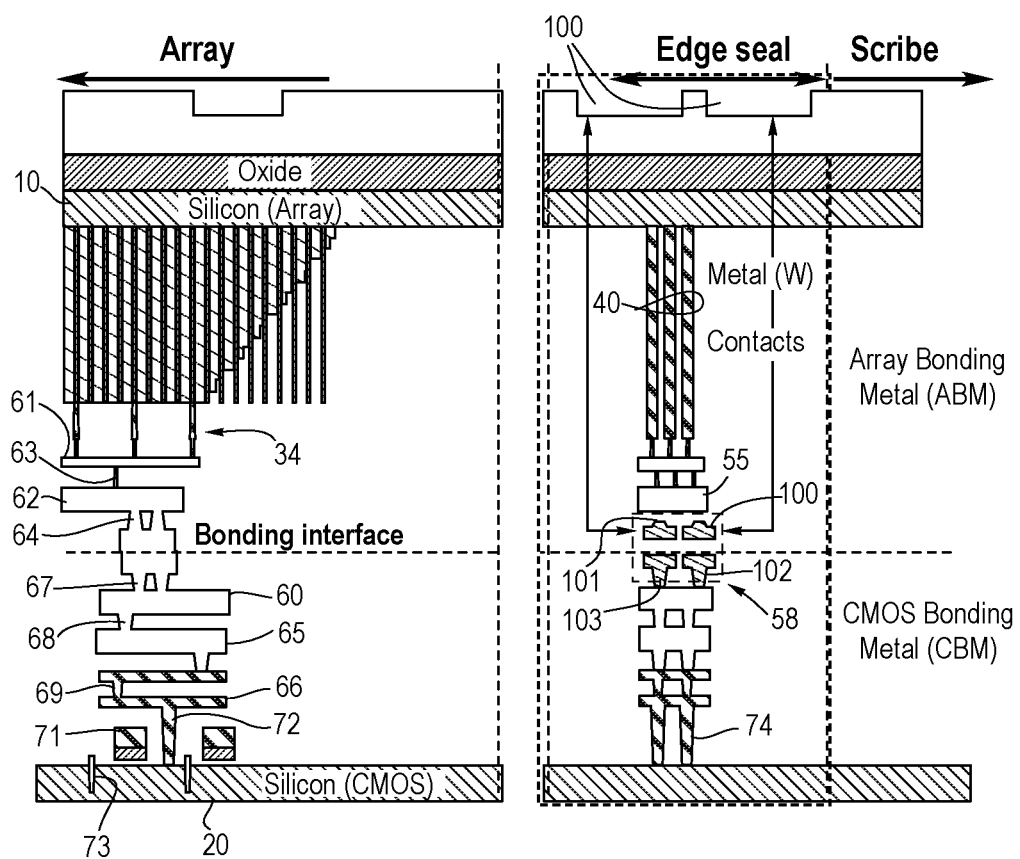
FIG. 4 is a cross-sectional view of an integrated circuit of an embodiment having a capacitor for use in die crack detection.

The following embodiments can be used to address this issue. As shown in FIG. 4, in one embodiment, the gap 58 between the edge seal portions of the first and second wafers 10, 20 is filled with a capacitor. In this embodiment, the capacitor comprises a first capacitor plate 100 formed in the edge seal portion of the first wafer 10 and a second capacitor plate 102 formed in the edge seal portion of the second wafer 20. These capacitor plates 100, 102 are connected to the other structures 55, 58 by vias 101, 103. When the first and second wafers 10, 20 are bonded together, the first and second capacitor plates 100, 102 are positioned on either side of the bonding interface to create the capacitor.

The first and second capacitor plates 100, 102 can be formed in any suitable fashion. FIGS. 5 and 6 are flow charts 500, 600 of methods for fabricating the capacitor plates 100, 102 in edge seal portions of the first and second wafer 10, 20, respectively. It should be noted that these methods are merely examples, and other methods can be used.

As shown in FIG. 5, in this embodiment, the first capacitor plate 100 is fabricated by performing an array bonding metal (ABM) trench formation on the same level as the array side bonding interface (act 510). Then, the ABM is filled with metal, such as, but not limited to, copper, aluminum, or tungsten (act 520). Next, metal polishing is performed (e.g., using a chemo-mechanical polishing (CMP) process) (act 530). An array wafer capacitor formation mask is then applied, which can be array side covered or masked by resist (act 540), and the ABM is recessed (e.g., to a predefined depth of 5 nanometers (nm) to 20 nm) (act 550). Finally, the array wafer capacitor formation mask is removed (e.g., using an asher) (act 560).

FIG. 6 illustrates a method of an embodiment for formation of the second capacitor plate 102 in the second wafer 20. In this method, the plate 102 is fabricated by forming a CMOS bonding metal (CBM) trench on the same level as the CMOS side bonding interface (act 610). Then, the trench is filled with metal, such as, but not limited to, copper, aluminum, or tungsten (act 620). Next, metal polishing is performed (e.g., using a chemo-mechanical polishing (CMP) process) (act 630). A CMOS array wafer capacitor formation mask is then applied, which can be CMOS side covered or masked by resist (act 640), and the CMB is recessed (e.g., to a predefined depth of 5 nm to 20 nm) (act 650). Finally, the CMOS wafer capacitor formation mask is removed (e.g., using an asher) (act 660).

Figure 7:
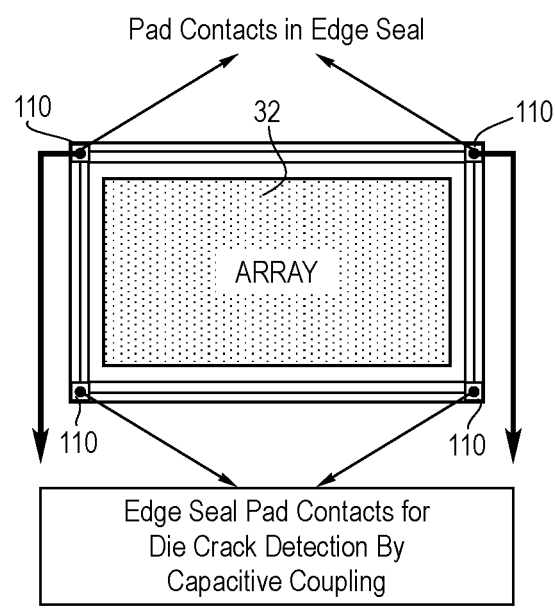
FIG. 7 is a top view of an integrated circuit of an embodiment.

The formed capacitor can be used in a method for detecting a crack in a die/integrated circuit. As shown in FIG. 7, in this embodiment, one or more contact pads 110 for test/crack detection are externally located on the integrated circuit and are electrically coupled with one of the first and second capacitor plates 100, 102. As will be explained in more detail below, these pads 110 can be used for die crack detection by capacitive coupling. It should be noted that the number and position of the contact pads 110 in the edge seal can differ from what is shown in FIG. 7 (e.g., (i) contact pads on the four corners of a die, (ii) contact pads mid-way at the edge seal ring of a die, a combination of (i) & (ii), and (iv) several edge seal ring pad contacts (e.g., at an equal intervals)).

Figure 8A:
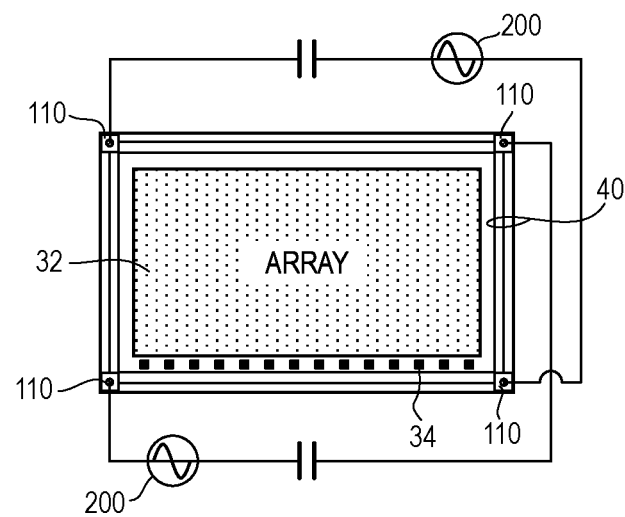
FIGS. 8A, 8B, and 8C are illustrations of different configurations for applying an alternating current waveform to testing pads of an integrated circuit of an embodiment.
Figure 8B:
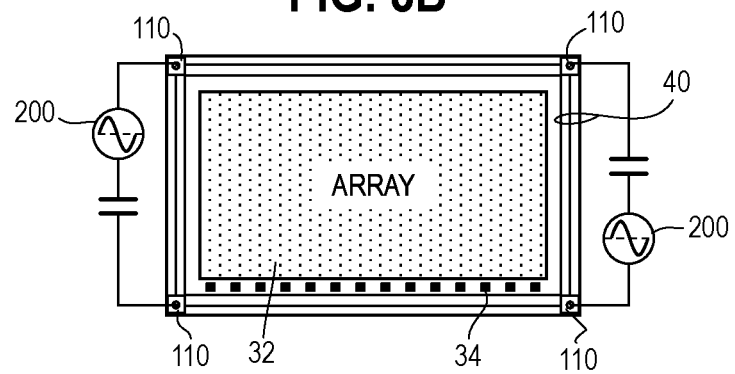
Figure 8C:
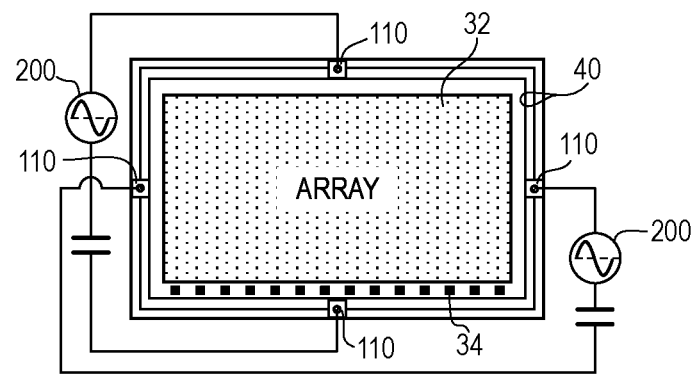
Figure 9:
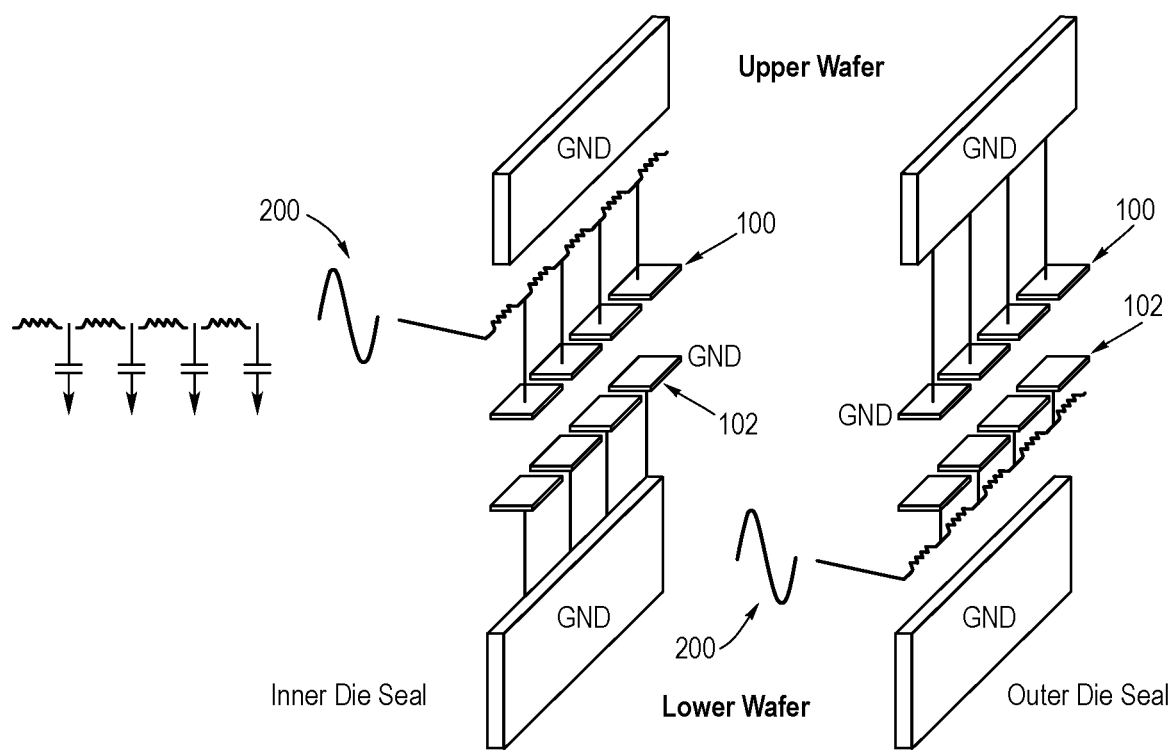
FIG. 9 is an illustration of a die crack testing process of an embodiment.

To test for a die crack, an alternating current waveform 200 is applied to the contact pads 100, where a shift in the alternating current waveform indicates a crack in the integrated circuit. FIGS. 8A, 8B, and 8C show different configurations of contact pads 100 and where current can be applied. It should be noted that there are merely examples, and other configurations can be used. The external testing contacts can be electrically coupled with one of the first and second capacitor plates 100, 102, with the other plate being connected to ground. As a result, as shown in FIG. 9, the alternating current waveform 200 can be applied to the top capacitor plate 100 (left-hand side of FIG. 9) or the bottom capacitor plate 102 (right-hand side of FIG. 9). The overall resistance in the wafer effectively provides a resistance (R), which, in combination with the capacitance (C) of the capacitor, results in an RC circuit.

This circuit can be used in a method for detecting a crack in the die. More specifically, if there are no cracks in the edge seal, the spacing of the capacitor plates will be constant, and there will be no fluctuation in the alternating current waveform applied to the testing pads. However, if there is a crack in the edge seal, the spacing of the capacitor plates will vary, which will result in a modulation in the alternating current waveform applied to the testing pads. Because of this phenomenon, the capacitor structures of this embodiment can be used in a method for detecting a crack in the integrated circuit by applying an alternating current waveform to the testing contact and monitoring for a shift in the alternating current waveform, which would indicate a crack in the integrated circuit.

It is intended that the foregoing detailed description be understood as an illustration of selected forms that the invention can take and not as a definition of the invention. For example, it will be understood that the present technology may be used in any wafer-to-wafer bonding application, not just for a wafer having dies with CMOS circuitry bonded to a wafer having memory or NAND dies. It is only the following claims, including all equivalents that are intended to define the scope of the claimed invention. Finally, it should be noted that any aspect of any of the embodiments described herein can be used alone or in combination with one another.

What is claimed is:

1. An integrated circuit comprising:
  a first wafer comprising a plurality of memory dies; and
  a second wafer comprising a plurality of control dies comprising control circuitry for the memory dies, wherein the first and second wafers are bonded together at a bonding interface creating a plurality of bonded memory and control dies;
  wherein each bonded memory and control die comprises:
    a first edge seal portion on a memory-die-side of the bonding interface that comprises a first capacitor plate;
    a second edge seal portion on a controller-die-side of the bonding interface that comprises a second capacitor plate, wherein the first and second capacitor plates are positioned on either side of the bonding interface to form a capacitor; and a plurality of external testing contacts electrically coupled with one of the first and second capacitor plates to detect a discontinuity in the bonding interface between the memory die and the control die.

2. The integrated circuit of claim 1, wherein the control circuitry comprises complementary metal-oxide-semiconductor (CMOS) circuitry.

3. The integrated circuit of claim 1, wherein the plurality of external testing contacts are on the first wafer.

4. The integrated circuit of claim 1, wherein the plurality of external testing contacts are on the second wafer.

5. The integrated circuit of claim 1, wherein the first capacitor plate is formed by trench formation and metal fill in the first wafer.

6. The integrated circuit of claim 1, wherein the second capacitor plate is formed by trench formation and metal fill in the second wafer.

7. A method for detecting a discontinuity in a bonding interface, the method comprising:
    applying an alternating current waveform to a contact that is electrically coupled with a capacitor plate formed in an integrated circuit; and
    detecting a bonding interface discontinuity by detecting a shift in the alternating current waveform;
    wherein the integrated circuit comprises:
        a first wafer comprising a plurality of memory dies; and
        a second wafer comprising a plurality of control dies comprising control circuitry for the memory dies, wherein the first and second wafers are bonded together at a bonding interface creating a plurality of bonded memory and control dies;
        wherein each bonded memory and control die comprises:
            a first edge seal portion on a memory-die-side of the bonding interface that comprises a first capacitor plate;
            a second edge seal portion on a controller-die-side of the bonding interface that comprises a second capacitor plate, wherein the first and second capacitor plates are positioned on either side of the bonding interface to form a capacitor; and
            a plurality of external testing contacts electrically coupled with one of the first and second capacitor plates to detect a discontinuity in the bonding interface between the memory die and the control die.

8. The method of claim 7, wherein the control circuitry comprises complementary metal-oxide-semiconductor (CMOS) circuitry.

9. The method of claim 7, wherein the plurality of external testing contacts are on the first wafer.

10. The method of claim 7, wherein the plurality of external testing contacts are on the second wafer.

11. The method of claim 7, wherein the first and second capacitor plates are formed by trench formation and metal fill.

12. An integrated circuit comprising:
    a first wafer comprising a plurality of memory dies; and
    a second water comprising a plurality of control dies comprising control circuitry for the memory dies, wherein the first and second wafers are bonded together at a bonding interface creating a plurality of bonded memory and control dies;
    wherein each bonded memory and control die comprises:
        a first edge seal portion on a memory-die-side of the bonding interface that comprises a first capacitor plate;
        a second edge seal portion on a controller-die-side of the bonding interface that comprises a second capacitor plate, wherein the first and second capacitor plates are positioned on either side of the bonding interface to form a capacitor; and
        means for detecting a discontinuity in the bonding interface between the memory die and the control die.

13. The integrated circuit of claim 12, wherein the means for detecting comprises a plurality of external testing contacts electrically coupled with one of the first and second capacitor plates.

14. The integrated circuit of claim 12, wherein the first and second capacitor plates are formed by trench formation and metal fill.

15. The integrated circuit of claim 13, wherein the plurality of external testing contacts are on the first wafer.

16. The integrated circuit of claim 13, wherein the plurality of external testing contacts are on the second wafer.

17. The integrated circuit of claim 12, wherein the memory dies comprise NAND dies and the control dies comprise complementary metal-oxide-semiconductor (CMOS) circuitry.

18. The integrated circuit of claim 1, wherein the first and second capacitor plates are located in a gap that is formed in the first and second edge seal portions after the first and second wafers are bonded together.

19. The method of claim 7, wherein the first and second capacitor plates are located in a gap that is formed in the first and second edge seal portions after the first and second wafers are bonded together.

20. The integrated circuit of claim 12, Wherein the first and second capacitor plates are located in a gap that is formed in the first and second edge seal portions after the first and second wafers are bonded together.

* * * * *